(12) United States Patent
Mcsporran et al.

(10) Patent No.: US 9,716,243 B2
(45) Date of Patent: Jul. 25, 2017

(54) INTERFACE LAYER FOR ELECTRONIC DEVICES

(71) Applicant: PILKINGTON GROUP LIMITED, Lathom (GB)

(72) Inventors: Neil Mcsporran, Perrysburg, OH (US); Gary Robert Nichol, Culcheth (GB); David Alan Strickler, Toledo, OH (US); Kevin David Sanderson, Upholland (GB)

(73) Assignee: Pilkington Group Limited, Lathom (GB)

( * ) Notice: Subject to any disclaimer, the term of this patent is extended or adjusted under 35 U.S.C. 154(b) by 0 days.

(21) Appl. No.: 14/392,111

(22) PCT Filed: May 30, 2014

(86) PCT No.: PCT/GB2014/051668
§ 371 (c)(1),
(2) Date: Nov. 24, 2015

(87) PCT Pub. No.: WO2014/191770
PCT Pub. Date: Dec. 4, 2014

(65) Prior Publication Data
US 2016/0093824 A1 Mar. 31, 2016

(30) Foreign Application Priority Data
May 31, 2013 (GB) .................................. 1309717.5

(51) Int. Cl.
*B32B 15/04* (2006.01)
*C23C 16/40* (2006.01)
(Continued)

(52) U.S. Cl.
CPC ...... *H01L 51/5206* (2013.01); *C03C 17/2453* (2013.01); *C03C 17/2456* (2013.01);
(Continued)

(58) Field of Classification Search
USPC ....... 428/426, 432, 688, 689, 697, 699, 701, 428/702; 427/255.28, 585, 126.3;
(Continued)

(56) References Cited

U.S. PATENT DOCUMENTS 6,355,353 B1 * 3/2002 Hyodo ................ C03C 17/3417
136/252
6,551,715 B1 * 4/2003 Seto ...................... C03C 17/245
428/212
(Continued)

FOREIGN PATENT DOCUMENTS

WO 2007027498 A1 3/2007
WO 2008029060 A2 3/2008
(Continued)

OTHER PUBLICATIONS

European Patent Office; International Search Report of PCT/GB2014/051668; Aug. 18, 2014; European Patent Office, Rijswijk, Netherlands.

*Primary Examiner* — Lauren R Colgan
(74) *Attorney, Agent, or Firm* — Marshall & Melhorn, LLC

(57) ABSTRACT

Transparent conducting electrodes incorporate an interface layer located on the transparent conducting oxide (TCO) layer of the electrode. The interface layer offers a suitable surface for deposition of further layers in order to fabricate electronic devices such as electrochromic devices or organic light emitting diodes. Problems such as pinholes and short circuiting, associated with the inherent roughness of the TCO layer, are reduced.

11 Claims, 3 Drawing Sheets

(51) Int. Cl.
*H01L 51/52* (2006.01)
*G02F 1/155* (2006.01)
*C03C 17/245* (2006.01)

(52) U.S. Cl.
CPC .......... *G02F 1/155* (2013.01); *H01L 51/5212* (2013.01); *H01L 51/5234* (2013.01); *H01L 2251/306* (2013.01)

(58) Field of Classification Search
USPC ...................................................... 204/192.1
See application file for complete search history.

(56) References Cited

U.S. PATENT DOCUMENTS

| | | |
|---|---|---|
| 7,820,296 B2 | 10/2010 | Myli et al. |
| 7,820,309 B2 | 10/2010 | Myli et al. |
| 7,968,201 B2 | 6/2011 | Nelson et al. |
| 8,339,031 B2 * | 12/2012 | Tchakarov ........ B32B 17/10036 |
| | | 313/503 |
| 8,506,768 B2 | 8/2013 | Myli et al. |
| 8,546,791 B2 | 10/2013 | Friend et al. |
| 8,696,879 B2 | 4/2014 | Myli et al. |
| 2002/0181109 A1* | 12/2002 | Chu ........................ G02B 1/116 |
| | | 359/586 |
| 2004/0113146 A1* | 6/2004 | Dahmani ............. C03C 17/3417 |
| | | 257/40 |
| 2008/0047602 A1* | 2/2008 | Krasnov ......... H01L 31/022466 |
| | | 136/256 |
| 2008/0308151 A1* | 12/2008 | Den Boer ......... H01L 31/02168 |
| | | 136/256 |
| 2009/0155619 A1* | 6/2009 | Nelson .............. H01L 31/02168 |
| | | 428/631 |
| 2011/0100446 A1* | 5/2011 | Krasnov ................ C23C 14/086 |
| | | 136/256 |
| 2012/0126273 A1* | 5/2012 | Korotkov ............... H05B 33/28 |
| | | 257/98 |
| 2013/0098435 A1* | 4/2013 | Zhao .................. H01L 31/02246 |
| | | 136/256 |
| 2013/0168651 A1 | 7/2013 | Tchakarov et al. |
| 2013/0174892 A1* | 7/2013 | Ganjoo .................... H01B 1/08 |
| | | 136/252 |
| 2014/0022621 A1 | 1/2014 | Kailasam et al. |
| 2014/0312327 A1* | 10/2014 | Bhandari .............. H01L 51/442 |
| | | 257/40 |

FOREIGN PATENT DOCUMENTS

| | | |
|---|---|---|
| WO | 2009036284 A1 | 3/2009 |
| WO | 2009153328 A1 | 12/2009 |

* cited by examiner

INTERFACE LAYER FOR ELECTRONIC DEVICES

BACKGROUND OF THE INVENTION

The invention concerns an interface layer for incorporation in devices produced on a transparent, electrically conducting electrode.

A number of electrical devices are known which are concerned with the generation or modification of light and which comprise an active region located between two essentially planar electrodes. In order to facilitate light transmission from (or to) the device, at least one electrode must be transparent.

Such devices include organic light emitting diodes (OLED) and electrochromic devices.

In OLEDs, an emissive electroluminescent layer comprising one or more layers of organic compound is located between the electrodes and emits light in response to an applied voltage.

In electrochromic devices a stack of materials which, in combination exhibit electrochromic properties is located between the electrodes and changes colour and, or opacity in response to an applied voltage.

Devices of the type which concern the invention are typically fabricated by providing a transparent conducting electrode comprising a transparent substrate and a conductive coating stack, and building successive layers thereon comprising the active region of the device and a further electrode—which may also be transparent. The transparent conducting electrode is frequently realised by depositing the conductive stack of coatings on the substrate using techniques such as chemical vapour deposition (CVD), which are well known to persons skilled in the art, see for example U.S. Pat. No. 7,968,201.

The conductive stack typically comprises a Transparent Conducting Oxide (TCO), i.e. a doped metal oxide, as the uppermost layer (i.e. the furthest layer from the substrate). In addition to offering the requisite electrical properties and mechanical stability, the TCO should offer a suitable surface for deposition of further layers as the rest of the device is fabricated. Examples of transparent conductive oxide materials include fluorine doped tin oxide ($SnO_2$:F), Zinc oxide doped with Aluminium, Gallium or Boron (ZnO:Al, ZnO:Ga, ZnO:B), Indium oxide doped with tin (ITO) and cadmium stannate.

Unfortunately, these surfaces can be inherently rough which can cause localised short circuits drawing current from an area up to a few millimeters from the point of short circuit. This results in a undesirable aesthetic effect as well as reducing the performance of the device.

Furthermore defects such as pinholes in the devices deposited on the TCO can result in similar problems.

The current invention addresses both of these problems.

According to the invention a transparent electrode comprises the features set out in claim 1 attached hereto.

The inventors have shown that incorporation of a thin interface layer between the top of the electrode stack (TCO) and the active region of the device overcomes problems associated with roughness of the TCO. Examples of interface layer materials include $TiO_2$, $SiO_2$, $SnO_2$ and ZnO and mixtures comprising any of these. The good device performance obtained when such interface layers are included is surprising because these materials have high electrical resistance.

In a preferred embodiment, the interface layer comprises a $TiO_2$ layer having a thickness greater than 5 nm.

In another preferred embodiment, the interface layer comprises ZnO, having a thickness between 25 and 80 nm.

In a further preferred embodiment, the TCO layer comprises a fluorine doped tin oxide.

In some embodiments, the underlayers comprise a layer of $SnO_2$ and a layer of $SiO_2$.

The transparent conducting electrode according to the invention is suitable for incorporation in electronic devices such as electrochromic devices and organic light emitting diodes.

According to a second aspect of the invention, a method of manufacturing a transparent conducting electrode comprises the steps set out in claim 8 attached hereto.

In a preferred embodiment, the underlayers, TCO and interface layer are deposited by Chemical Vapour Deposition (CVD). The CVD may be done on the float glass ribbon produced during the float glass production process.

In another preferred embodiment, the underlayers, TCO and interface layer are deposited by Plasma Enhanced CVD.

In another preferred embodiment, the underlayers, TCO and interface layer are deposited by sputtering.

Preferably, the interface layer is selected from $TiO_2$, $SiO_2$ and ZnO. More preferably, the interface comprises $TiO_2$ having a thickness of less than 5 nm.

In another preferred embodiment, the interface layer comprises ZnO, having a thickness between 25 and 80 nm.

In some embodiments, the TCO layer comprises a fluorine doped tin oxide.

In some embodiments, the underlayers comprise a layer of $SnO_2$ and a layer of $SiO_2$.

Materials such as $TiO_2$ and ZnO are is rendered more hydrophilic upon exposure to ultraviolet (UV) radiation. Such treatment of interface layers according to the invention renders the electrode more receptive to deposition of subsequent layers as the device is fabricated, particularly where such layers are deposited by so-called 'wet' chemical methods i.e. techniques involving liquid solutions.

In another aspect of the invention, use, as a transparent conducting electrode, of an electrically conducting coating stack located on a transparent substrate;
the stack comprising at least one underlayer and a transparent conducting oxide (TCO) layer located on the underlayers,
is characterised by the electrode having an interface layer located on the transparent conducting oxide layer.

BRIEF DESCRIPTION OF THE DRAWINGS

The invention will now be described with reference to the accompanying figures in which.

All of the figures are for illustrative purposes only and the relative thicknesses of the layers are not to scale.

DETAILED DESCRIPTION OF THE INVENTION

Figure 1:
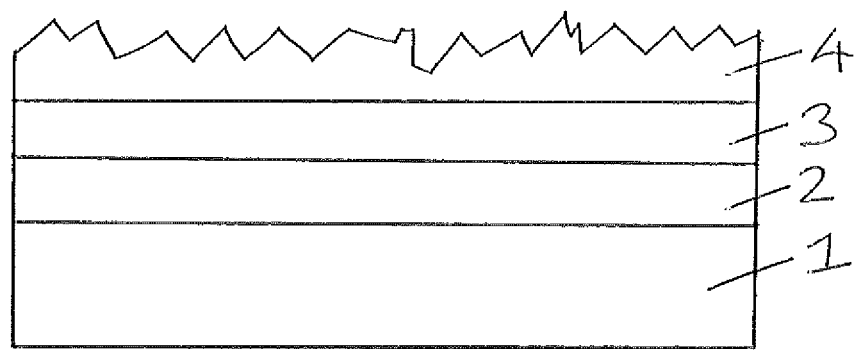
FIG. 1 shows a transparent conducting electrode of the prior art.

Referring to FIG. 1, a transparent conducting electrode of the type concerned by the invention typically comprises a glass substrate 1 bearing a conductive stack of coatings 2, 3 and 4. In the example shown, based on NSG's TEC™ series of coated glass, the stack comprises underlayers of $SnO_2$ 2 and $SiO_2$ 3 and a TCO layer 4 of $SnO_2$:F.

The TCO layer 4 typically has a rough surface (although the scale of the roughness is exaggerated for illustrative purposes here) which can give rise to problems during device operation as previously alluded to.

Figure 2:
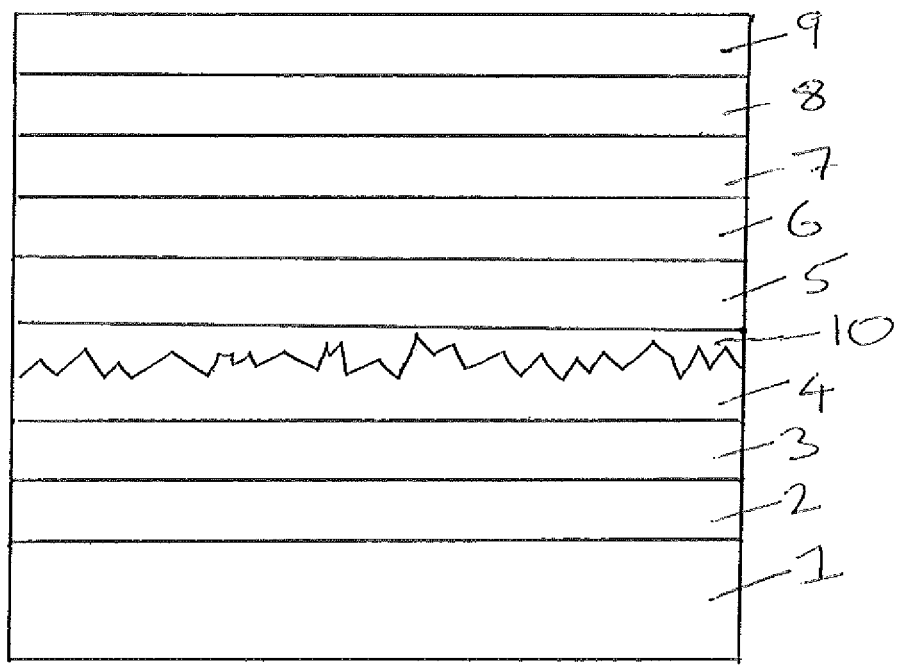
FIG. 2 shows an electrochromic device incorporating a transparent conducting electrode according to the invention

Referring to FIG. 2, an electrochromic device according to the invention comprises a transparent electrode 1-4, an ion storage layer 5, an ion conductor (electrolyte) layer 6, a layer of electrochromic material 7 and a further transparent conducting layer 8. A further layer 9 of transparent material such as glass or plastic would also typically be included.

During operation, an electrical potential is applied between transparent conducting layers 4 and 8 which causes redox reactions to occur in the electrochromic and ion storage layers 7 and 5, with charge compensation by ion migration across the ion conductor layer 6. Typically, Li$^+$ ions are used in the ion conductor layer 6.

These reactions are accompanied by changes in colour/transmission of the electrochromic layer 7.

The various layers may be deposited by techniques that are well known to a person skilled in the art, such as sputtering, PECVD (Plasma Enhanced Chemical Vapour Deposition) or solution deposition. Moreover the skilled person will be aware that some electrochromic devices may incorporate additional layers to those shown in this example.

According to the invention, the device incorporates a further interface layer 10 between the TCO layer 4 and the ion storage layer 5. In this example interface layer comprises $TiO_2$ and its inclusion mitigates the problems associated with roughness of the TCO layer 4.

Figure 3:
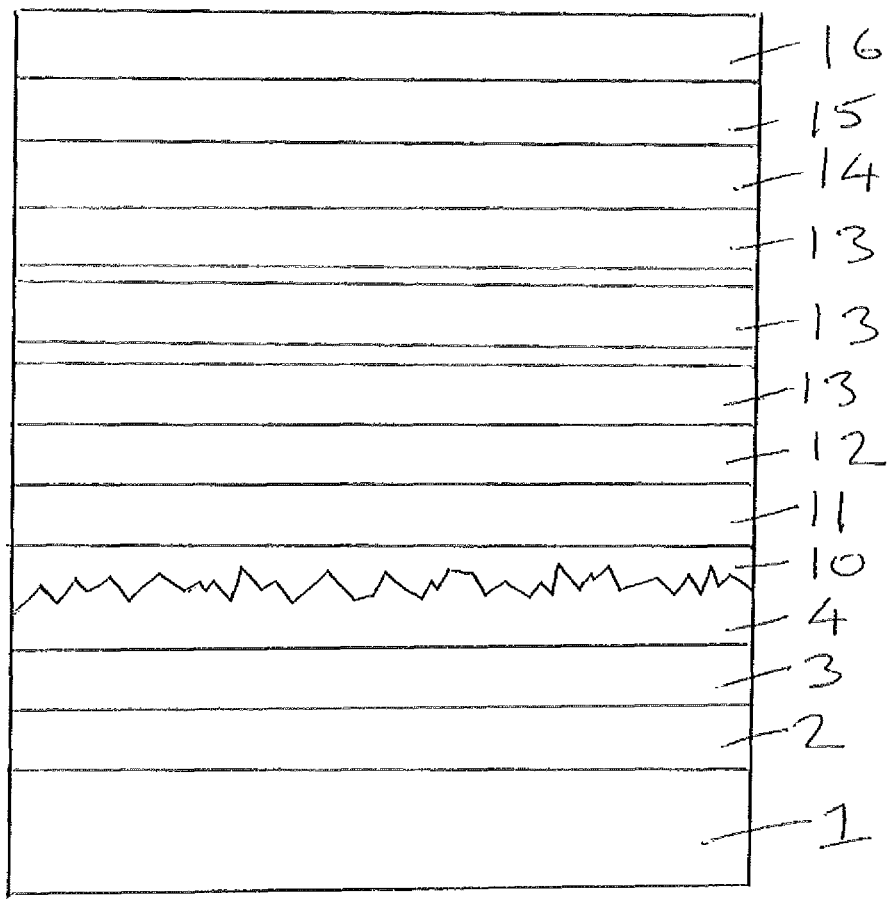
FIG. 3 shows an organic light emitting diode incorporating a transparent conducting electrode according to the invention and FIG. 4 illustrates a so-called 'dynamic coater' used for laboratory scale chemical vapour deposition of coatings on a substrate.

Referring to FIG. 3, an OLED device according to the invention comprises a transparent electrode 1-4, a hole injection layer (HIL) 11, a hole transport layer (HTL) 12, one or more emissive layers 13, a hole blocking layer (HBL) 14, an electron transport layer (ETL) 15 and a further electrode 16.

During operation, a voltage is applied between the electrodes and electron-hole recombination in the region of the emissive layers give rise to excitons' (a bound state of the electron-hole combination) which on relaxation give rise to an emission in the visible region. Light thus generated exits the device through the transparent substrate 1.

According to the invention, the device incorporates a further interface layer 10 between the TCO layer 4 and the HIL 5. In this example interface layer comprises $TiO_2$ and its inclusion mitigates the problems associated with roughness of the TCO layer 4.

Examples 1-9

A series of samples were prepared on 3.2 mm glass substrate. Each sample incorporated a stack of $SiO_2$ (example 9 only)/$SnO_2$/$SiO_2$/$SnO2$:F layers of varying thickness topped by an interface layer of $TiO_2$, $SnO_2$ or $SiO_2$. The samples are detailed in table 1 (layer thicknesses in Angstrom) along with an indication of observed sheet resistance and transmittance.

The stack interface layers were deposited by atmospheric pressure CVD.

TABLE 1

Physical Properties of Transparent Electrodes with Interface Layers

| | Example | | | | | | | | |
|---|---|---|---|---|---|---|---|---|---|
| | 1 | 2 | 3 | 4 | 5 | 6 | 7 | 8 | 9 |
| Glass | 3.2 mm | 3.2 mm | 3.2 mm | 3.2 mm | 3.2 mm | 3.2 mm | 3.2 mm | 3.2 mm | 3.2 mm |
| SiO2 | | | | | | | | | 150 |
| SnO2 | 250 | 300 | 250 | 250 | 250 | 250 | 250 | 250 | 250 |
| SiO2 | 250 | 220 | 250 | 250 | 250 | 250 | 250 | 250 | 250 |
| SnO2:F | 3400 | 2300 | 3400 | 7600 | 3400 | 3400 | 3400 | 3400 | 3400 |
| TiO2 | | 400 | 200 | 200 | 100 | 50 | | | 200 |
| SnO2 | | | | | | | 1000 | | |
| SiO2 | | | | | | | | 200 | |
| Rs (ohm/sq) | 13.6 | 20.0 | 13.6 | 6.0 | 13.6 | 13.6 | 13.6 | 13.6 | 13.6 |
| % T | 84.5 | 65.1 | 77.3 | 74.2 | 82.6 | 84.1 | 81.1 | 85.3 | 77.3 |

Note that the resistivities of $TiO_2$ and $SiO_2$ are both in excess of 1 MΩ·cm. The transmission values are likely to change when these stacks are incorporated in an actual device as reflectance is affected by the adjacent layers.

Example 10

A transparent conductive oxide was deposited on a glass substrate with the structure glass/$SnO_2$(60 nm)/$SiO_2$(15 nm)$SnO_2$:F(720 nm). 25 nm of undoped tin oxide was deposited on top. Table 2 shows the properties with and without the additional undoped tin oxide layer. Surprisingly the sheet resistance of the coating is not substantially affected by the addition of a highly resistive layer

TABLE 2

| | Tvis | Coated side reflection | Sheet Resistance | Haze |
|---|---|---|---|---|
| Reference | 82.1% | 10.0% | 8.7Ω/☐ | 11.0% |
| Tin oxide buffer coated | 81.2% | 10.4% | 8.7Ω/☐ | 11.5% |

The TCO was used in a photovoltaic module resulting in an improved Voc and FF as shown in Table 3

TABLE 3

Normalised performance data for Photovoltaic Device incorporating Interface Layer

| | Jsc | Voc | FF |
|---|---|---|---|
| Reference | 1.00 | 1.00 | 1.00 |
| Tin oxide buffer coated | 1.00 | 1.01 | 1.01 |

Examples 11-16

A series of experiments were conducted to deposit ZnO layers on various substrate to further investigate the suitability of this material as an interface layer according to the invention.

Figure 4:
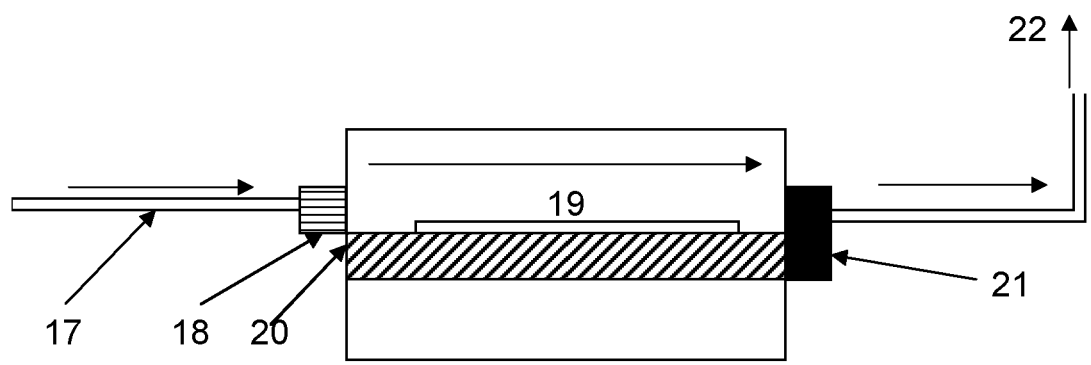

For examples 11-15, the deposition was done using a 'dynamic' laboratory scale coater as illustrated in FIG. 4. In this apparatus, the premixed precursors move towards the coater through a heated line 17 before they reach baffle section 18 which equalises the precursor flow before it enters the sealed coating section. The glass substrate 19 sits on a heated carbon block 20 which is heated to the desired temperature using either heating elements (not shown) inserted inside the carbon block or by an induction coil (not shown) around the sealed coating section. Any unreacted precursor or by products are then directed towards fish tail exhaust 21 and continue towards the incinerator 22. The arrows show the direction in which the gaseous mixture moves.

The reactants (DEZ and t-butyl acetate) were delivered by passing $N_2$ carrier gas through bubblers (not shown). The DEZ and t-butyl acetate bubbler temperatures were 100° C. and 85° C. respectively. Reactant quantities are expressed in terms of the total gas flow that reaches the substrate surface.

Example 16 was done 'on-line' by atmospheric pressure CVD, on a float glass ribbon produced during the float glass manufacturing process. In this case, a thin film evaporator as described in U.S. Pat. No. 5,090,985 was used to deliver the reactants, whose quantities are again expressed as a percentage of total gas flow.

Table 4 summarises the reaction conditions used to generate examples 11-16. SLPM=Standard Liters per Minute; TEC10FS™ and TEC10™ are Nippon Sheet Glass Group products comprising coated glass substrates providing a transparent conducting electrode based on a fluorine doped tin oxide.

TABLE 4

| Sample | % DEZ | % t-butyl acetate | DEZ bubbler flow (SLPM)* | t-butyl acetate bubbler flow (SLPM) | Total gas flow (SLPM) | Linespeed (inch/min) | Substrate |
| --- | --- | --- | --- | --- | --- | --- | --- |
| 11 | 1 | 5 | 0.28 | 0.91 | 36 | 200 | SiO2 coated glass |
| 12 | 1 | 10 | 0.28 | 1.82 | 36 | 200 | SiO2 coated glass |
| 13 | 1.3 | 10 | 0.37 | 1.82 | 36 | 200 | TEC10FS ™ |
| 14 | 3 | 4 | 0.85 | 0.62 | 36 | 150 | TEC10 ™ |
| 15 | 3 | 4 | 0.85 | 0.62 | 36 | 150 | SiO2 coated glass |
| 16 | 1.5 | 4 | | | 630 | 318 | TEC10 |

Table 5 summarises, for examples 11-16, measured values for ZnO thickness (in Angstrom), percentage haze, percentage visible transmission (Tvis), and sheet resistance of the sample Rs.

| Sample | ZnO thickness | % Haze | % Tvis | Rs |
| --- | --- | --- | --- | --- |
| 11 | 246 | 0.33 | 92.1 | — |
| 12 | 383 | 0.43 | 91.4 | — |
| 13 | 416 | 3.25 | 86.0 | 10.65 |
| 14 | 660 | 1.13 | 85.1 | 12.70 |
| 15 | 800 | 0.26 | 85.3 | — |
| 16 | 251 | 2.12 | 86.4 | 18.62 |

The transmission levels for all of examples 11-16 indicate that the addition of a Zinc oxide layer has not caused any significant absorption. Haze levels on the silica coated substrates indicate an inherently smooth coating, and the roughness levels when coated on TEC 10 are similar to the substrate values.

Sheet resistance has been increased slightly by the over coat, but still in the range suitable for PV devices.

The invention claimed is:

1. A transparent conducting electrode incorporated in an electrochromic device or an organic light emitting diode comprising:
   an electrically conducting coating stack located on a transparent substrate, the stack comprising in sequence from the transparent substrate:
   at least two underlayers, wherein one of the at least two underlayers comprises a layer of $SnO_2$ and another of the at least two underlayers comprises a layer of $SiO_2$; and
   a transparent conducting oxide (TCO) layer located directly on the at least two underlayers and comprising fluorine doped tin oxide with a thickness of 2300 Ångstrom to 3400 Ångstrom, and wherein
   the electrode comprises a smoothing interface layer located directly on the TCO layer, the interface layer comprising one or more materials selected from $TiO_2$, $SiO_2$, $SnO_2$ and ZnO; and wherein
   the transparent conducting electrode comprises a sheet resistance in the range of 13.6 to 20.0 ohm/sq.

2. The electrode according to claim 1, wherein the interface layer comprises a $TiO_2$ layer having a thickness greater than 5 nm.

3. The electrode according to claim 1, wherein the interface layer comprises ZnO, having a thickness between 25 and 80 nm.

4. A method of manufacturing a transparent conducting electrode incorporated in an electrochromic device or an organic light emitting diode comprising the steps of:
   depositing at least two underlayers on a transparent substrate wherein one of the at least two underlayers comprises a layer of $SnO_2$ and another of the at least two underlayers comprises a layer of $SiO_2$;
   depositing a transparent conducting oxide layer (TCO) directly on the at least two underlayers, wherein the TCO layer comprises fluorine doped tin oxide with a thickness of 2300 Ångstrom to 3400 Ångstrom; and
   depositing a smoothing interface layer on the TCO, wherein the interface layer comprises a layer selected from the group consisting of $TiO_2$, $SiO_2$, $SnO_2$ or ZnO and, wherein the transparent conducting electrode comprises a sheet resistance in the range 13.6 to 20.0 ohm/sq.

5. The method according to claim 4, wherein the underlayers, TCO and interface layer are deposited by Chemical Vapour Deposition (CVD).

6. The method according to claim 5, wherein the underlayers, TCO and interface layer are deposited on a continuous glass ribbon during the float glass manufacturing process.

7. The method according to claim 5, wherein the underlayers, TCO and interface layer are deposited by Plasma Enhanced CVD.

8. The method according to claim 4, wherein the underlayers, TCO and interface layer are deposited by sputtering.

9. The method according to claim 4, comprising the step of depositing an interface layer of $TiO_2$ to a thickness of greater than 5 nm.

10. The method according to claim 4, comprising the step of depositing an interface layer of ZnO, to a thickness between 25 and 80 nm.

11. The method according to claim 4, further comprising the step of exposing the interface layer to ultraviolet (UV) radiation.

* * * * *